(12) United States Patent
Nishina et al.

(10) Patent No.: US 12,176,315 B2
(45) Date of Patent: Dec. 24, 2024

(54) ELECTRICAL CONNECTION MEMBER, ELECTRICAL CONNECTION STRUCTURE, AND METHOD FOR MANUFACTURING ELECTRICAL CONNECTION MEMBER

(71) Applicant: PROTERIAL, LTD., Tokyo (JP)

(72) Inventors: Junya Nishina, Osaka (JP); Masaaki Ishio, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 472 days.

(21) Appl. No.: 17/270,590

(22) PCT Filed: Nov. 30, 2018

(86) PCT No.: PCT/JP2018/044162
§ 371 (c)(1),
(2) Date: Feb. 23, 2021

(87) PCT Pub. No.: WO2020/110287
PCT Pub. Date: Jun. 4, 2020

(65) Prior Publication Data
US 2021/0257327 A1   Aug. 19, 2021

(51) Int. Cl.
*H01B 1/02* (2006.01)
*B23K 20/04* (2006.01)
(Continued)

(52) U.S. Cl.
CPC .............. *H01L 24/37* (2013.01); *B23K 20/04* (2013.01); *H01B 1/02* (2013.01); *H01B 13/0026* (2013.01);
(Continued)

(58) Field of Classification Search
CPC ... H01L 24/37; H01L 24/35; H01L 23/49524; H01L 2224/352; H01L 2224/35847;
(Continued)

(56) References Cited

U.S. PATENT DOCUMENTS

| | | |
|---|---|---|
| 5,187,967 A | 2/1993 | Singh et al. |
| 6,569,764 B1 | 5/2003 | Hirashima et al. |

(Continued)

FOREIGN PATENT DOCUMENTS

| | | |
|---|---|---|
| DE | 102011086687 A1 | 5/2013 |
| DE | 102015215786 A1 | 4/2016 |

(Continued)

OTHER PUBLICATIONS

English Translation WO2018/207856, Rohm Co LTD (Year: 2018).*

(Continued)

*Primary Examiner* — Steven T Sawyer
(74) *Attorney, Agent, or Firm* — Millen, White, Zelano & Branigan P.C.; William F. Nixon

(57) ABSTRACT

An electrical connection member (1, 301, 401, 501, 601) includes a clad material (10, 110, 610) including at least both a first Cu layer (12) made of a Cu material and a low thermal expansion layer (11) made of an Fe material or Ni material having an average thermal expansion coefficient from room temperature to 300° C. smaller than that of the first Cu layer, the first Cu layer and the low thermal expansion layer being bonded to each other.

10 Claims, 7 Drawing Sheets

(51) Int. Cl.
  *H01B 13/00* (2006.01)
  *H01L 23/00* (2006.01)
  *B23K 101/40* (2006.01)
  *B23K 103/12* (2006.01)
  *H01L 23/495* (2006.01)

(52) U.S. Cl.
  CPC .......... *H01L 24/35* (2013.01); *B23K 2101/40* (2018.08); *B23K 2103/12* (2018.08); *H01L 23/49524* (2013.01); *H01L 2224/352* (2013.01); *H01L 2224/35847* (2013.01); *H01L 2224/37155* (2013.01); *H01L 2224/3716* (2013.01); *H01L 2224/37541* (2013.01); *H01L 2224/3756* (2013.01); *H01L 2224/37565* (2013.01); *H01L 2224/37639* (2013.01); *H01L 2224/37647* (2013.01); *H01L 2224/37655* (2013.01)

(58) Field of Classification Search
  CPC ... H01L 2224/37155; H01L 2224/3716; H01L 2224/37541; H01L 2224/3756; H01L 2224/37565; H01L 2224/37639; H01L 2224/37647; H01L 2224/37655; H01L 21/4842; H01L 24/744; H01L 24/77; H01L 2224/3512; H01L 2224/35125; H01L 2224/3583; H01L 2224/35831; H01L 2224/35985; H01L 2224/3701; H01L 2224/37011; H01L 2224/37012; H01L 2224/37013; H01L 2224/37032; H01L 2224/77101; H01L 2224/77272; H01L 2224/84065; H01L 2224/84075; H01L 2224/84203; H01L 2224/84205; H01L 2224/84214; H01L 2924/0781; H01L 2924/181; H01L 2924/3511; H01L 2924/3512; H01L 2924/35121; H01L 24/40; H01L 24/84; H01L 2224/37033; H01L 2224/37147; H01L 2224/40245; H01L 2224/84801; H01L 2224/8484; H01L 2224/8485; B23K 20/04; B23K 2101/40; B23K 2103/12; H01B 1/02; H01B 13/0026; B21J 5/027; B21K 23/00
  See application file for complete search history.

(56) References Cited

U.S. PATENT DOCUMENTS

| | | | |
|---|---|---|---|
| 9,281,270 B2 | 3/2016 | Geinitz et al. | |
| 2001/0033022 A1* | 10/2001 | Ewer | H01L 23/34 |
| | | | 257/E23.08 |
| 2006/0022298 A1 | 2/2006 | Shiraishi et al. | |
| 2013/0256390 A1 | 10/2013 | Yamaguchi et al. | |
| 2014/0252401 A1 | 9/2014 | Nakabayashi et al. | |
| 2014/0299998 A1 | 10/2014 | Geinitz et al. | |
| 2015/0187726 A1 | 7/2015 | Park et al. | |
| 2015/0200178 A1 | 7/2015 | Otremba et al. | |
| 2016/0111379 A1 | 4/2016 | Ishiyama et al. | |
| 2016/0141231 A1 | 5/2016 | Yoshihara et al. | |
| 2016/0260651 A1 | 9/2016 | Yeung et al. | |
| 2017/0092596 A1 | 3/2017 | Yoshihara | |
| 2017/0271275 A1 | 9/2017 | Inaba | |
| 2017/0338190 A1 | 11/2017 | Fujino et al. | |
| 2020/0075529 A1 | 3/2020 | Otsuka et al. | |

FOREIGN PATENT DOCUMENTS

| | | |
|---|---|---|
| JP | 5-102386 A | 4/1993 |
| JP | 6-151662 A | 5/1994 |
| JP | 6-224359 A | 8/1994 |
| JP | 10-190175 A | 7/1998 |
| JP | 2001-68503 A | 3/2001 |
| JP | 2002-359335 A | 12/2002 |
| JP | 2004-204257 A | 7/2004 |
| JP | 2005-228976 A | 8/2005 |
| JP | 2005-243685 A | 9/2005 |
| JP | 2006-49341 A | 2/2006 |
| JP | 2009259981 A | 11/2009 |
| JP | 2009-285732 A | 12/2009 |
| JP | 2012182241 A | 9/2012 |
| JP | 2014-170945 A | 9/2014 |
| JP | 2014-175321 A | 9/2014 |
| JP | 2015-23211 A | 2/2015 |
| JP | 2015-130495 A | 7/2015 |
| JP | 2016-4796 A | 1/2016 |
| JP | 2017073456 A | 4/2017 |
| JP | 2018-186220 A | 11/2018 |
| JP | 6460160 B2 | 1/2019 |
| WO | 2005/071733 A1 | 8/2005 |
| WO | 2016-136457 A1 | 9/2016 |
| WO | 18207856 A1 | 11/2018 |

OTHER PUBLICATIONS

English Translation DE102015213085, Published Jun. 16, 2016, Siemens AG (Year: 2016).*
International Search Report dated Jan. 29, 2019 issued in corresponding PCT/JP2018/044162 application (2 pages).
JP Office Action dated Jul. 17, 2018 issued in corresponding JP 2017-125316 application.
JP Office Action dated Mar. 6, 2018 issued in corresponding JP 2017-125316 application.
Supplemental Partial European Search Report EP18941183 dated Jul. 13, 2021 (pp. 1-12).
Groover Mikell P: "Fundamentals of Modern Manufacturing, Materials, Processes, and Systems 4th ed." Jan. 1, 2010 (chapter 19, pp. 405-415).
Supplementary European Search Report dated Aug. 17, 2021 in corresponding European patent application No. 18941183.8. (pp. 1-15).
Office Action in corresponding CN 201880096486.X dispatched Dec. 30, 2023 (pp. 1-8) and English translation thereof (pp. 1-12).
Office Action in corresponding EP 18941183.8 dated Feb. 7, 2024 (pp. 1-10).

* cited by examiner

ELECTRICAL CONNECTION MEMBER, ELECTRICAL CONNECTION STRUCTURE, AND METHOD FOR MANUFACTURING ELECTRICAL CONNECTION MEMBER

TECHNICAL FIELD

The present invention relates to an electrical connection member, an electrical connection structure using the electrical connection member, and a method for manufacturing the electrical connection member.

BACKGROUND ART

In general, a power module using an electrical connection member that electrically connects one connection target member to another connection target member is known. Such a power module is disclosed in Japanese Patent Laid-Open No. 2015-023211, for example.

Japanese Patent Laid-Open No. 2015-023211 discloses a power module including a lead frame, a semiconductor chip arranged on the lead frame, and an aluminum wire that electrically connects the lead frame to the semiconductor chip. In this power module, the aluminum wire is ultrasonically welded to a surface of the lead frame on which the semiconductor chip is placed and the upper surface of the semiconductor chip, which have different heights, such that the lead frame and the semiconductor chip are electrically connected to each other.

Furthermore, the semiconductor chip and the aluminum wire are resin-molded in a state in which the lead frame and the semiconductor chip are electrically connected to each other by the aluminum wire.

PRIOR ART DOCUMENT

Patent Document

Patent Document 1: Japanese Patent Laid-Open No. 2015-023211

SUMMARY OF THE INVENTION

Problems to be Solved by the Invention

However, in the power module disclosed in Japanese Patent Laid-Open No. 2015-023211, the aluminum wire made of metal (Al) having a large thermal expansion coefficient tends to expand due to heat generated during energization. The aluminum wire is fixed to the lead frame or the semiconductor chip (connection target member) at an ultrasonically welded portion (electrical connection portion) and is fixed by the resin mold, and thus it cannot sufficiently thermally expand. Thus, a stress due to a significant reduction in thermal expansion is conceivably applied to the ultrasonically welded portion. Consequently, damage such as cracks and peeling may disadvantageously occur in the ultrasonically welded portion. This problem is particularly problematic in a structure such as a power module, which tends to become hot due to a high current flowing through it. When the aluminum wire is connected to the lead frame or the semiconductor chip under pressure in order to obtain sufficient connection strength, a pressure cannot be evenly applied to a portion to be connected due to the different height, and a connection with insufficient connection strength at the ultrasonically welded portion may disadvantageously be made. Such problems related to the aluminum wire conceivably occur even in a configuration using a copper wire.

The present invention has been proposed in order to solve the aforementioned problems, and an object of the present invention is to provide an electrical connection member, an electrical connection structure using the electrical connection member, and a method for manufacturing the electrical connection member capable of making a connection with sufficient connection strength at an electrical connection portion while significantly reducing or preventing damage to the electrical connection portion due to thermal expansion.

Means for Solving the Problems

An electrical connection member according to a first aspect of the present invention includes a clad material including at least both a first Cu layer made of a Cu material and a low thermal expansion layer made of an Fe material or Ni material having an average thermal expansion coefficient from room temperature to 300° C. smaller than that of the first Cu layer, the first Cu layer and the low thermal expansion layer being bonded to each other. A surface of the clad material on a side of the first Cu layer includes a first surface and a second surface connected to the first surface via a step and located closer to the low thermal expansion layer than the first surface. The "Cu material" refers to a pure Cu material containing 99 mass % or more of Cu (copper) or a Cu alloy material containing 50 mass % or more of Cu (copper) as a main component. Furthermore, the "Fe material" refers to a pure Fe material containing 99 mass % or more of Fe (iron) or an Fe alloy material containing 50 mass % or more of Fe (iron) as a main component. Moreover, the "Ni material" refers to a pure Ni material containing 99 mass % or more of Ni (nickel) or a Ni alloy material containing 50 mass % or more of Ni (nickel) as a main component.

As described above, the electrical connection member according to the first aspect of the present invention includes the clad material including at least both the first Cu layer made of the Cu material and the low thermal expansion layer made of the Fe material or Ni material having an average thermal expansion coefficient from room temperature to 300° C. smaller than that of the first Cu layer, the first Cu layer and the low thermal expansion layer being bonded to each other. Accordingly, in a temperature range from room temperature to 300° C., which is the normal operating environment of the electrical connection member, thermal expansion of the first Cu layer made of the Cu material having large thermal expansion can be significantly reduced or prevented by the low thermal expansion layer. Consequently, the thermal expansion can be reduced in the entire clad material including the first Cu layer and the low thermal expansion layer, and thus application of a stress due to the thermal expansion to an electrical connection portion of the electrical connection member can be significantly reduced or prevented. Therefore, damage such as cracks and peeling to the electrical connection portion due to the thermal stress can be significantly reduced or prevented. Furthermore, the surface of the clad material on the side of the first Cu layer includes the first surface and the second surface connected to the first surface via the step and located closer to the low thermal expansion layer than the first surface. Thus, even when there is a difference (step) in height between one connection target member and another connection target member to which the electrical connection member is electrically connected, the step formed on the surface of the clad material on the side of the first Cu layer can absorb at least a portion of the step between one connection target member and another connection target member. Consequently, the influence of the step can be reduced, and uneven pressure application due to the step can be significantly reduced or prevented. Thus, in the electrical connection portion, the electrical connection member and one connection target member (another connection target member) can be connected to each other with sufficient connection strength. Therefore, while damage to the electrical connection portion due to the thermal expansion is significantly reduced or prevented, the connection can be made with sufficient connection strength in the electrical connection portion. Thus, it is particularly effective to use the electrical connection member according to the present invention for an electrical connection structure provided in a power module, for example, which tends to become hot due to a high current flowing through it.

In the aforementioned electrical connection member according to the first aspect, the surface of the clad material on the side of the first Cu layer includes the first surface and the second surface connected to the first surface via the step and located closer to the low thermal expansion layer than the first surface. Accordingly, when one connection target member and another connection target member are connected to the side of the first Cu layer of the electrical connection member, electricity (current) easily flows through the first Cu layer closer to the electrical connection portion. Thus, the first Cu layer through which a current flows is made of the Cu material having a low volume resistivity such that a power loss at the time of power transmission can be reduced.

In the aforementioned electrical connection member according to the first aspect, a surface of the clad material opposite to the first Cu layer is preferably flat without a step. In this case, the electrical connection member has a form in which the surface of the clad material on the side of the first Cu layer includes the two flat first and second surfaces adjacent to both sides of the step, and the surface of the clad material opposite to the first Cu layer is flat. Accordingly, when one connection target member and another connection target member are connected to the side of the first Cu layer of the electrical connection member, a pressure can be easily and evenly applied from the flat surface of the clad material opposite to the first Cu layer. Consequently, in the electrical connection portion, the electrical connection member and one connection target member (another connection target member) can be connected to each other with more sufficient connection strength.

In the aforementioned electrical connection member according to the first aspect, the clad material preferably further includes a second Cu layer bonded to a side of the low thermal expansion layer opposite to the first Cu layer and made of a Cu material. Furthermore, a surface of the clad material on a side of the second Cu layer is preferably flat without a step. In this case, the electrical connection member has a form in which the surface of the clad material on the side of the first Cu layer includes the two flat first and second surfaces adjacent to both sides of the step, and the surface of the clad material on the side of the second Cu layer is flat. Accordingly, during manufacturing of the clad material, for example, warpage of the clad material due to the high ductility of the first Cu layer made of the Cu material can be significantly reduced or prevented by the second Cu layer made of the Cu material similar to that of the first Cu layer and bonded to the side of the low thermal expansion layer opposite to the first Cu layer. Furthermore, the second Cu layer made of the Cu material having a low volume resistivity is provided such that the volume resistivity of the electrical connection member can be effectively reduced.

In the aforementioned electrical connection member according to the first aspect, a portion of the clad material on a side of the second surface is preferably divided into a plurality of portions along a direction in which the step extends. Accordingly, a plurality of electrical connection portions that protrude in a direction intersecting with the direction in which the step extends are formed in the plurality of portions divided on the side of the second surface of the clad material, and thus one connection target member arranged on a side of the first surface and a plurality of other connection target members arranged on a side of the second surface can be electrically connected to each other by one electrical connection member. Consequently, as compared with a case in which one connection target member arranged on the side of the first surface and one of a plurality of other connection target members arranged on the side of the second surface are electrically connected to each other by one electrical connection member, the number of electrical connection members required for connection can be effectively reduced.

In the aforementioned electrical connection member according to the first aspect, the low thermal expansion layer is preferably made of an Fe material or Ni material having an average thermal expansion coefficient of $15 \times 10^{-6}$/K or less from room temperature to 300° C. Accordingly, the thermal expansion of the first Cu layer made of the Cu material having large thermal expansion can be effectively significantly reduced or prevented by the low thermal expansion layer having an average thermal expansion coefficient of $15 \times 10^{-6}$/K or less from room temperature to 300° C. Thus, damage such as cracks and peeling to the electrical connection portion can be effectively significantly reduced or prevented. As the average thermal expansion coefficient of the low thermal expansion layer from room temperature to 300° C. is smaller like $12 \times 10^{-6}$/K or less, $10 \times 10^{-6}$/K or less, $8 \times 10^{-6}$/K or less, and $6 \times 10^{-6}$/K or less, the effect of significantly reducing or preventing thermal expansion of the electrical connection member is enhanced, and thus it is preferable.

In the aforementioned electrical connection member according to the first aspect, each of the first surface and the second surface preferably includes an electrical connection portion, and at least one of the electrical connection portion of the first surface or the electrical connection portion of the second surface preferably includes a plated layer made of Ag, a Ag alloy, Ni, or a Ni alloy. Accordingly, when connection materials made of a metal material such as brazing filler metal are used to connect the electrical connection member to the connection target members, the wettability of the connection materials can be improved by the plated layer. Consequently, the electrical connection member and the connection target members can be reliably connected to each other by the connection materials.

In this case, the plated layer is preferably formed on an entire surface of the clad material. Accordingly, unlike a case in which the plated layer is formed only on a portion of the surface of the clad material, it is not necessary to form a mask, and thus the plated layer can be easily formed. Furthermore, the electrical connection portions can be ensured in wide ranges of the first surface and the second surface, respectively, and thus the electrical connection member and the connection target members can be reliably and easily connected to each other by the connection materials. Moreover, Ag, a Ag alloy, Ni, or a Ni alloy is superior in corrosion resistance as compared with Cu and an Fe alloy containing no Cr, and thus the corrosion resistance of the clad material can be improved by the plated layer.

An electrical connection structure according to a second aspect of the present invention includes an electrical connection member including a clad material that includes at least both a first Cu layer made of a Cu material and a low thermal expansion layer made of an Fe material or Ni material having an average thermal expansion coefficient from room temperature to 300° C. smaller than that of the first Cu layer, the first Cu layer and the low thermal expansion layer being bonded to each other, the clad material having a surface on a side of the first Cu layer, the surface including a first surface and a second surface connected to the first surface via a step and located closer to the low thermal expansion layer than the first surface, and a connection material to connect the electrical connection member to a connection target member in an electrical connection portion of the first surface or the second surface.

In the electrical connection structure according to the second aspect of the present invention, similarly to the electrical connection member according to the first aspect described above, damage to the electrical connection portion, which is a portion in which the electrical connection member and the connection target member are connected to each other via the connection material, due to the thermal expansion can be significantly reduced or prevented, and the connection can be made with sufficient connection strength in the electrical connection portion.

A method for manufacturing an electrical connection member according to a third aspect of the present invention includes producing a clad material including at least both a first Cu layer made of a Cu material and a low thermal expansion layer made of an Fe material or Ni material having an average thermal expansion coefficient from room temperature to 300° C. smaller than that of the first Cu layer, the first Cu layer and the low thermal expansion layer being roll-bonded to each other, and performing plastic working on the produced clad material to form, on a surface of the clad material on a side of the first Cu layer, a first surface and a second surface connected to the first surface via a step and located closer to the low thermal expansion layer than the first surface.

In the method for manufacturing an electrical connection member according to the third aspect of the present invention, in addition to the same advantageous effects as those of the electrical connection member according to the first aspect described above, the plastic working is performed on the clad material such that the first surface and the second surface connected to the first surface via the step and located closer to the low thermal expansion layer than the first surface can be easily formed on the surface of the clad material on the side of the first Cu layer. As the plastic working, means such as pressing or roll reduction can be used, for example.

In the aforementioned method for manufacturing an electrical connection member according to the third aspect, an unnecessary portion that flows when the first surface and the second surface are formed is preferably cut and removed after the first surface and the second surface are formed. Accordingly, a variation in the shape of the electrical connection member can be reduced.

In the aforementioned method for manufacturing an electrical connection member according to the third aspect, a portion of the clad material on a side of the second surface is preferably divided into a plurality of portions along a direction in which the step extends after the first surface and the second surface are formed. Accordingly, as compared with a case in which one of a plurality of connection target members arranged on the side of the second surface and another connection target member arranged on a side of the first surface are electrically connected to each other by one electrical connection member, the number of electrical connection members required for connection can be effectively reduced.

In the aforementioned method for manufacturing an electrical connection member according to the third aspect, the clad material including the first Cu layer, the low thermal expansion layer, and a second Cu layer made of a Cu material on a side of the low thermal expansion layer opposite to the first Cu layer, the first Cu layer, the low thermal expansion layer, and the second Cu layer being roll-bonded to each other is preferably produced. Accordingly, during manufacturing of the clad material, warpage of the clad material due to the high ductility of the first Cu layer made of the Cu material can be significantly reduced or prevented by the second Cu layer made of the Cu material similar to that of the first Cu layer and bonded to the side of the low thermal expansion layer opposite to the first Cu layer. Furthermore, the second Cu layer made of the Cu material having a low volume resistivity is provided such that the volume resistivity of the electrical connection member can be effectively reduced.

Effect of the Invention

According to the present invention, as described above, it is possible to provide the electrical connection member, the electrical connection structure using the electrical connection member, and the method for manufacturing the electrical connection member capable of making a connection with sufficient connection strength at the electrical connection portion while significantly reducing or preventing damage to the electrical connection portion due to thermal expansion.

MODES FOR CARRYING OUT THE INVENTION

Embodiments of the present invention are hereinafter described on the basis of the drawings.

First Embodiment

The structure of an electrical connection member 1 according to a first embodiment of the present invention is now described with reference to FIGS. 1 and 2.
[Structure of Electrical Connection Member]

Figure 3:
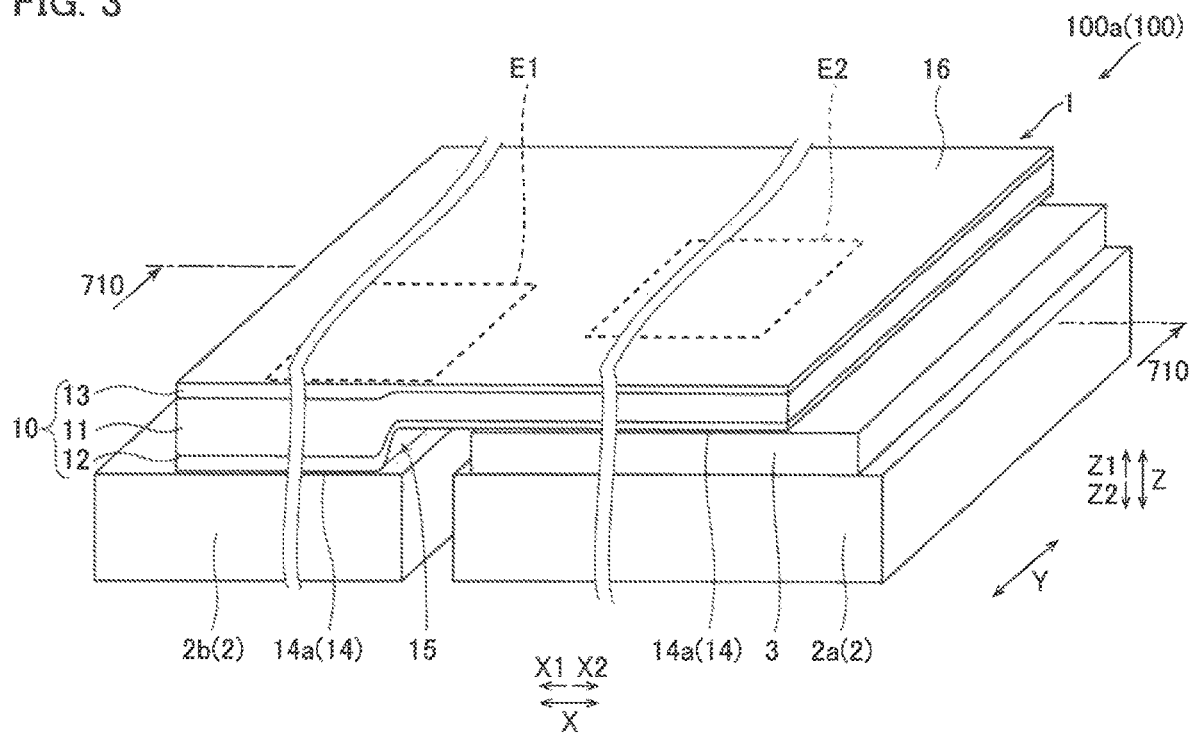
FIG. 3 A perspective view showing an electrical connection structure according to the first embodiment of the present invention.

The electrical connection member 1 according to the first embodiment of the present invention is a member that electrically connects one connection target member (e.g. a lead frame 2 shown in FIG. 3) to another connection target member (e.g. a semiconductor element 3 shown in FIG. 3). The maximum length (maximum thickness) of the electrical connection member 1 in the thickness direction (Z direction) can be set to suit the amount of energization and is 0.01 mm to 2.0 mm, for example, but is not limited to this maximum thickness. For example, when it is applied to an application such as a power module having a large amount of energization, the maximum length (maximum thickness) of the electrical connection member 1 is preferably 0.1 mm or more and 1.0 mm or less.

Figure 1:
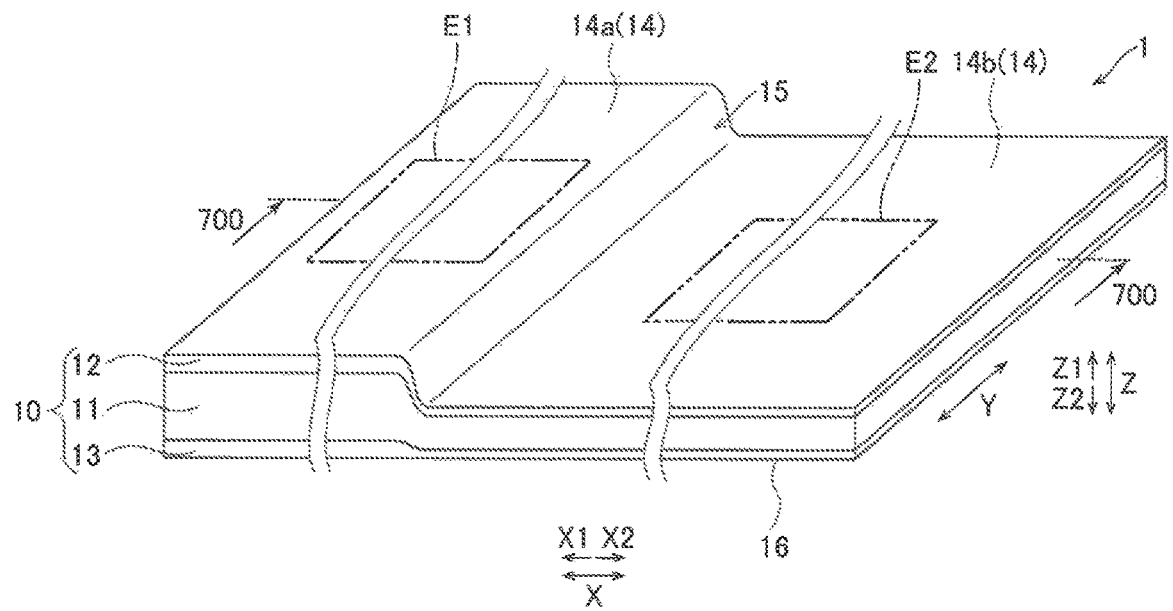
FIG. 1 A perspective view showing an electrical connection member according to a first embodiment of the present invention.

As shown in FIG. 1, the electrical connection member 1 is made of a plate-shaped clad material 10. The clad material 10 is a three-layered clad material 10 including a low thermal expansion layer 11 made of an Fe material or Ni material with low thermal expansion, a Cu layer 12 stacked on and bonded to a first surface 11a of the low thermal expansion layer 11 on a first side (Z1 side) in the thickness direction (Z direction), and a Cu layer 13 stacked on and bonded to a second surface 11b of the low thermal expansion layer 11 on a second side (Z2 side) in the thickness direction. Cu materials of the Cu layer 12 and the Cu layer 13 may have the same composition or different compositions. At an interface Ia between the low thermal expansion layer 11 and the Cu layer 12 and an interface Ib between the low thermal expansion layer 11 and the Cu layer 13, elements of the layers are diffused and bonded at the atomic level. The Cu layer 12 and the Cu layer 13 are examples of a "first Cu layer" and a "second Cu layer" in the claims, respectively.

Examples of the Cu materials include a pure Cu material and a Cu alloy material. The pure Cu material contains pure Cu containing 99 mass % or more of Cu (copper). The Cu alloy material contains a Cu alloy containing 50 mass % or more of Cu (copper) as a main component. Furthermore, examples of the Fe material include a pure Fe material and an Fe alloy material. The pure Fe material includes a pure Fe material containing 99 mass % or more of Fe (iron). The Fe alloy material includes an Fe alloy material containing 50 mass % or more of Fe (iron) as a main component. Examples of the Ni material include a pure Ni material and a Ni alloy material. The pure Ni material contains pure Ni containing 99 mass % or more of Ni (nickel). The Ni alloy material includes a Ni alloy material containing 50 mass % or more of Ni (nickel) as a main component.

The low thermal expansion layer 11 is made of an Fe material or Ni material having an average thermal expansion coefficient from room temperature to 300° C. smaller than that of the Cu material of the Cu layer 12. Preferably, the low thermal expansion layer 11 is made of an Fe alloy having an average thermal expansion coefficient of $15 \times 10^{-6}$/K or less from room temperature (30° C.) to 300° C. The average thermal expansion coefficient of C1020 (oxygen-free copper) as an example of the Cu material from room temperature to 300° C. is about $17 \times 10^{-6}$/K.

An example of the pure Fe material having an average thermal expansion coefficient of $15 \times 10^{-6}$/K or less from room temperature to 300° C. includes a pure Fe material in which C (carbon) has been reduced to 0.02 mass % or less, which is made of electrolytic iron, armco iron, carbonyl iron, or reduced iron, for example. Examples of the Fe alloy material having an average thermal expansion coefficient of $15 \times 10^{-6}$/K or less from room temperature to 300° C. include an Fe alloy material made of a Ni—Co—Fe alloy, an Fe alloy material made of a Ni—Fe alloy, an Fe alloy material made of a Ni—Cr—Fe alloy, and an Fe alloy material made of a Ni—Cr—Co—Fe alloy.

An example of the Fe alloy material includes a stainless steel material (SUS material) made of stainless steel. The Fe material according to the present invention is not limited to these pure Fe materials or Fe alloy materials.

An example of the Ni—Co—Fe alloy includes a 29Ni-17Co—Fe alloy containing 29 mass % of Ni (nickel), 17 mass % of Co (cobalt), trace inclusions, inevitable impurities, and the balance Fe. The average thermal expansion coefficient of the 29Ni-17Co—Fe alloy from room temperature to 300° C. is about $5 \times 10^{-6}$/K.

Examples of the Ni—Fe alloys include a 36 alloy containing 36 mass % of Ni, trace inclusions, inevitable impurities, and the balance Fe, and a 42 alloy containing 42 mass % of Ni, trace inclusions, inevitable impurities, and the balance Fe. The average thermal expansion coefficient of the 36 alloy from room temperature to 300° C. is about $2 \times 10^{-6}$/K or less.

An example of the Ni—Cr—Fe alloy includes an Fe alloy containing 42 mass % of Ni, 6 mass % of Cr (chromium), trace inclusions, inevitable impurities, and the balance Fe. The average thermal expansion coefficient of the Fe alloy having the above composition from room temperature to 300° C. is about $8 \times 10^{-6}$/K.

An example of the Ni—Cr—Co—Fe alloy includes an Fe alloy containing 29 mass % of Ni, 4 mass % or more and 10 mass % or less of Cr, 17 mass % of Co, trace inclusions, inevitable impurities, and the balance Fe. The average thermal expansion coefficient of the Fe alloy having the above composition from room temperature to 300° C. is about $6 \times 10^{-6}$/K.

Examples of the SUS material include Fe alloy materials made of some ferritic stainless steel. Examples of the ferritic stainless steel include SUS410, SUS430, and SUS444 specified in JIS standards. For example, the average thermal expansion coefficient from room temperature to 300° C. is about 10×10$^{-6}$/K in SUS410, about 11×10$^{-6}$/K in SUS430, and about 10×10$^{-6}$/K in SUS444.

Examples of the Ni material include a pure Ni material and a Ni alloy material. Examples of the Ni alloy material include a Ni—Cu alloy containing 10 mass % or more and less than 50 mass % of Cu and the balance Ni (preferably monel metal containing about 30 mass % of Cu and the balance Ni), a Ni—Nb alloy containing 3 mass % or more and 10 mass % or less (preferably 4.5 mass % or more and 5.5 mass % or less) of Nb (niobium) and the balance Ni, a Ni—Nb—C alloy containing 3 mass % or more and 10 mass % or less (preferably 4.5 mass % or more and 5.5 mass % or less) of Nb, 0.005 mass % or more and 0.50 mass % or less (preferably 0.10 mass % or more and 0.40 mass % or less) of C (carbon), and the balance Ni, and a Ni—C alloy containing 0.03 mass % or more and 0.20 mass % or less of C, trace elements (one or more of Mn, Si, and Al), and the balance Ni. The average thermal expansion coefficient of pure Ni from room temperature to 300° C. is about 13×10$^{-6}$/K, and the average thermal expansion coefficient of monel metal from room temperature to 300° C. is about 12×10$^{-6}$/K.

The Fe material or Ni material of the low thermal expansion layer 11 can be appropriately selected according to the specifications of the electrical connection member 1. For example, when it is desired to improve the corrosion resistance of the low thermal expansion layer 11, it is preferable that the low thermal expansion layer 11 be made of an Fe alloy containing Cr or pure Ni. Furthermore, for example, when it is desired to sufficiently reduce or prevent thermal expansion of the electrical connection member 1, it is preferable that the low thermal expansion layer 11 be made of a 29Ni-17Co—Fe alloy or 36 alloy having a particularly small thermal expansion coefficient, for example.

Each of the Cu layer 12 and the Cu layer 13 is made of a Cu material (a pure Cu material or Cu alloy material) having high electrical conductivity. As the pure Cu materials of the Cu layer 12 and the Cu layer 13, C1000 series such as C1020 (oxygen-free copper), C1100 (tough pitch copper), and C1220 (phosphorus deoxidized copper) specified in JIS H3100 can be used. As the Cu alloy materials of the Cu layer 12 and the Cu layer 13, C2000 series specified in JIS H3100 can be used, for example.

Thus, when a current flows through the electrical connection member 1, the current mainly flows through the Cu layer 12 located on the surface layer of the clad material 10 such that the electrical conductivity of the electrical connection member 1 is improved.

In the first embodiment, a surface 14 of the clad material 10 on the Cu layer 12 side (Z1 side) includes a first surface 14a and a second surface 14b connected to the first surface 14a via a step 15 and located closer to the low thermal expansion layer 11 (Z2 side) than the first surface 14a. That is, the clad material 10 is formed such that the heights of the first surface 14a and the second surface 14b in the Z direction are different from each other. The height of the first surface 14a and the height of the second surface 14b can be appropriately adjusted based on the size of the connection target member in the Z direction, for example.

A surface 16 (Z2 side) (a surface of the clad material 10 on the Cu layer 13 side) of the clad material 10 opposite to the Cu layer 12 has no step, and substantially the entire surface is flat. Consequently, the thickness of the clad material 10 on the first surface 14a side (X1 side) is larger than the thickness of the clad material 10 on the second surface 14b side (X2 side).

The ratio (thickness ratio) of the thicknesses of the low thermal expansion layer 11, the Cu layer 12, and the Cu layer 13 to the thickness of the clad material 10 on the first surface 14a side in the Z direction and the ratio (thickness ratio) of the thicknesses of the low thermal expansion layer 11, the Cu layer 12, and the Cu layer 13 to the thickness of the clad material 10 on the second surface 14b side in the Z direction may be substantially equal to or different from each other.

The step 15 extends along a Y direction. In the step 15 of the clad material 10, the thickness of the clad material 10 continuously changes from the X1 side to the X2 side. At this time, the thicknesses of the low thermal expansion layer 11, the Cu layer 12, and the Cu layer 13 of the clad material 10 also continuously change from the X1 side to the X2 side in the step 15. In the Cu layer 12 having a large amount of deformation in the Z direction in the step 15, it is preferable that the Cu layer 12 on the first surface 14a side and the Cu layer 12 on the second surface 14b side be continuously connected. That is, it is preferable that the Cu layer 12 be not cut off or the Cu layer 12 be not formed with defects such as cracks and holes. Thus, it is possible to significantly reduce or prevent a decrease in the electrical conductivity of the electrical connection member 1. Defects may be allowed in a portion (e.g. less than 50% of the Cu layer 12) of the Cu layer 12.

In order to significantly reduce or prevent warpage of the clad material 10, it is preferable that the Cu layer 12 and the Cu layer 13 have the same thickness ratio with respect to the low thermal expansion layer 11 in the Z direction. Furthermore, in order to significantly reduce or prevent warpage of the clad material 10, it is preferable that the Cu layer 12 and the Cu layer 13 be made of Cu materials having the same ductility and the same composition.

The thickness ratio of the layers of the clad material 10 (the thickness t2 of the Cu layer 12: the thickness t1 of the low thermal expansion layer 11: the thickness t3 of the Cu layer 13) is 1:1:1, 1:2:1, 1:3:1, or 1:8:1, for example. The thickness ratio of the layers can be set in consideration of the balance between the amount of thermal expansion and the volume resistivity of the clad material 10. The thickness t1 of the low thermal expansion layer 11 is preferably 25% or more of the thickness t4 of the clad material 10. When the thickness t1 of the low thermal expansion layer 11 is 25% of the thickness t4 of the clad material 10, the thickness ratio is 1.5:1:1.5.

It is assumed that the low thermal expansion layer 11 is made of a 36 alloy, and the Cu layer 12 and the Cu layer 13 are made of pure Cu (average thermal expansion coefficient from room temperature to 300° C.: about 17×10$^{-6}$/K, volume resistivity: about 1.7×10$^{-8}$ Ω·m). At this time, when the thickness ratio is 1:1:1, the average thermal expansion coefficient of the clad material 10 from room temperature to 300° C. is about 11×10$^{-6}$/K, and the volume resistivity of the clad material 10 is about 2.2×10$^{-8}$ Ω·m. When the thickness ratio is 1:3:1, the average thermal expansion coefficient of the clad material 10 from room temperature to 300° C. is about 7×10$^{-6}$/K, and the volume resistivity of the clad material 10 is about 4.1×10$^{-8}$ Ω·m. When the thickness ratio is 1:8:1, the average thermal expansion coefficient of the clad material 10 from room temperature to 300° C. is about 4×10$^{-6}$/K, and the volume resistivity of the clad material 10 is about 7.8×10$^{-8}$ Ω·m.

It is assumed that the low thermal expansion layer 11 is made of a 42 alloy, and the Cu layer 12 and the Cu layer 13 are made of pure Cu. At this time, when the thickness ratio is 1:1:1, the average thermal expansion coefficient of the clad material 10 from room temperature to 300° C. is about $12\times10^{-6}$/K, and the volume resistivity of the clad material 10 is about $2.5\times10^{-8}$ Ω·m. When the thickness ratio is 1:2:1, the average thermal expansion coefficient of the clad material 10 from room temperature to 300° C. is about $9\times10^{-6}$/K, and the volume resistivity of the clad material 10 is about $4.1\times10^{-8}$ Ω·m. When the thickness ratio is 1:8:1, the average thermal expansion coefficient of the clad material 10 from room temperature to 300° C. is about $6\times10^{-6}$/K, and the volume resistivity of the clad material 10 is about $7.7\times10^{-8}$ Ω·m.

It is assumed that the low thermal expansion layer 11 is made of a 29Ni-17Co—Fe alloy, and the Cu layer 12 and the Cu layer 13 are made of pure Cu. At this time, when the thickness ratio is 1:1:1, the average thermal expansion coefficient of the clad material 10 from room temperature to 300° C. is about $10\times10^{-6}$/K, and the volume resistivity of the clad material 10 is about $2.5\times10^{-8}$ Ω·m. When the thickness ratio is 1:2:1, the average thermal expansion coefficient of the clad material 10 from room temperature to 300° C. is about $6\times10^{-6}$/K, and the volume resistivity of the clad material 10 is about $4.1\times10^{-8}$ Ω·m. When the thickness ratio is 1:8:1, the average thermal expansion coefficient of the clad material 10 from room temperature to 300° C. is about $3\times10^{-6}$/K, and the volume resistivity of the clad material 10 is about $7.8\times10^{-8}$ Ω·m.

[Configuration of Electrical Connection Structure]

An electrical connection structure 100a, which is a portion of a power module 100 using the electrical connection member 1 according to the first embodiment, is now described with reference to FIGS. 3 and 4.

Figure 4:
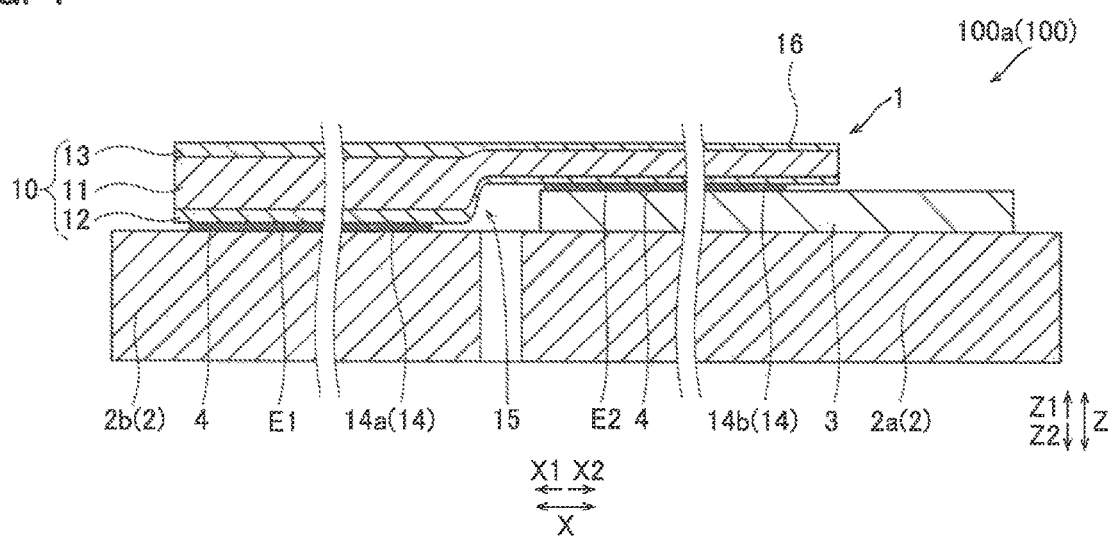
FIG. 4 A sectional view taken along the line 710-710 in FIG. 3.

As shown in FIGS. 3 and 4, the electrical connection member 1 is used for the electrical connection structure 100a, which is a portion of the power module 100 in which the lead frame 2 and the semiconductor element 3 such as a switching element are connected, for example. The electrical connection member 1 inverted from the state shown in FIGS. 1 and 2 such that the surface 14 on the Cu layer 12 side is located below (Z2 side), and the surface 16 on the Cu layer 13 side is located above (Z1 side) is arranged on the upper surface (Z1 side surface) of the lead frame 2 and the upper surface of the semiconductor element 3. The lead frame 2 and the semiconductor element 3 are examples of a "connection target member" in the claims.

The lead frame 2 is divided into a first portion 2a in which the semiconductor element 3 is arranged on the upper surface thereof and a second portion 2b in which the semiconductor element 3 is not arranged. The step 15 of the electrical connection member 1 preferably has a length in the Z direction substantially equal to the thickness (the length in the Z direction) of the semiconductor element 3.

In the electrical connection structure 100a, the electrical connection member 1 is connected to the lead frame 2 and the semiconductor element 3 via a connection material 4 such that the lead frame 2 and the semiconductor element 3 are electrically connected to each other via the electrical connection member 1.

Specifically, in an electrical connection portion E1 of the first surface 14a of the electrical connection member 1, the electrical connection member 1 and the lead frame 2 are connected to each other via a connection material 4. In an electrical connection portion E2 of the second surface 14b of the electrical connection member 1, the electrical connection member 1 and the semiconductor element 3 are connected to each other via the connection material 4.

The step 15 of the electrical connection member 1 absorbs a difference (step) in height in the Z direction between the upper surface of the lead frame 2 and the upper surface of the semiconductor element 3 such that the influence of the difference in height can be substantially eliminated.

Figure 9:
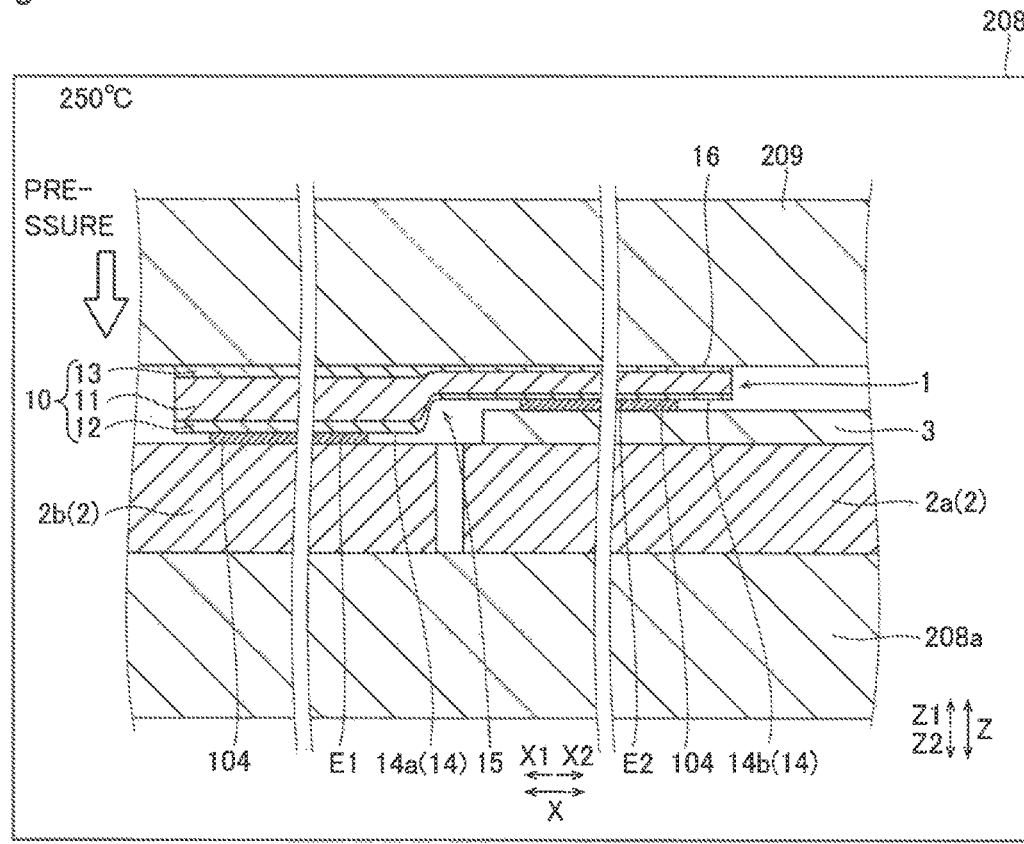
FIG. 9 A schematic sectional view for illustrating a manufacturing process for the electrical connection structure using the electrical connection member according to the first embodiment of the present invention.

The connection materials 4 are made of Ag (silver) obtained by reducing connection material pastes 104 (see FIG. 9) containing silver oxide microparticles and a reducing agent (e.g. triethylene glycol) by heat treatment. The connection materials 4 do not substantially melt up to the melting point (about 960° C.) of Ag, and thus when the power module 100 is used, it is possible to reliably ensure a connection between the electrical connection member 1 and the lead frame 2 or the semiconductor element 3 even when the power module 100 reaches a high temperature of about 200° C. Consequently, the mechanical strength of the electrical connection structure 100a in a high-temperature environment is improved.

The connection materials 4 are layered with a nano-order thickness, for example. In FIG. 4, the thicknesses (the lengths in the Z direction) of the layers of the connection materials 4 are exaggerated.

The electrical connection structure 100a may be resin-molded. This makes it possible to stably maintain the electrical connection structure 100a.

[Method for Manufacturing Electrical Connection Member]

A method for manufacturing the electrical connection member 1 according to the first embodiment is now described with reference to FIGS. 1, 2, and 5 to 7.

Figure 5:
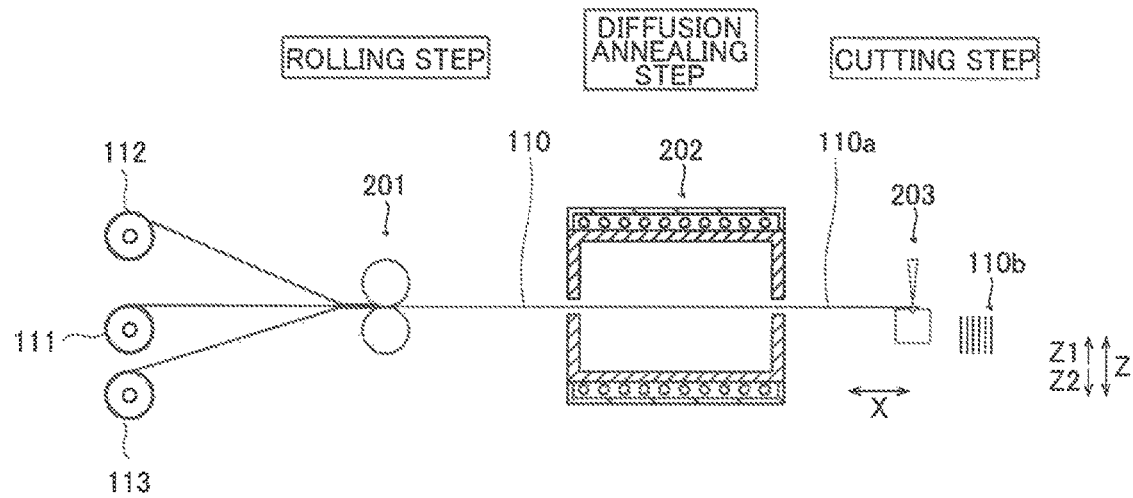
FIG. 5 A schematic view for illustrating a manufacturing process for the electrical connection member according to the first embodiment of the present invention.

First, as shown in FIG. 5, strip-shaped (plate-shaped) Cu plate materials 112 and 113 made of a Cu material (a pure Cu material or Cu alloy material) and a low thermal expansion plate material 111 made of an Fe material or Ni material having an average thermal expansion coefficient from room temperature to 300° C. smaller than that of the Cu material of the Cu plate material 112 are prepared. The lengths of the low thermal expansion plate material 111, the Cu plate material 112, and the Cu plate material 113 in the width direction (Y direction) are substantially the same. Then, while the Cu plate material 112 is arranged (stacked) on a first surface of the low thermal expansion plate material 111 on the Z1 side, and the Cu plate material 113 is arranged (stacked) on a second surface of the low thermal expansion plate material 111 on the Z2 side, roll-bonding is continuously performed by a roller 201 (rolling step). In the course of the rolling step, intermediate annealing can be performed if necessary.

Thus, a strip-shaped and three-layered clad material 110 in which the Cu layer 12, the low thermal expansion layer 11, and the Cu layer 13 are stacked in this order is produced. At this time, the Cu layer 12 and the Cu layer 13 having the same ductility sandwich the low thermal expansion layer 11 such that warpage of the clad material 110 toward the Cu layer 12 or the Cu layer 13 can be significantly reduced or prevented.

Then, the strip-shaped clad material 110 is continuously heat-treated in an annealing furnace 202 to be continuously diffusion-annealed (diffusion annealing step). Thus, a strip-shaped clad material 110a in which the low thermal expansion layer 11 and the Cu layer 12 are diffusion-bonded at the atomic level, and the low thermal expansion layer 11 and the Cu layer 13 are diffusion-bonded at the atomic level is produced. The strip-shaped clad material 110a may be produced such that the length thereof in the width direction (Y direction, see FIG. 1) is equal to that of the electrical connection member 1, or is an integral multiple of the length of the electrical connection member 1 in the width direction, for example. For example, when the strip-shaped clad material 110a is produced so as to have a wider size such as an integral multiple, the produced clad material 110a may be slit with the length of the electrical connection member 1 in the width direction.

Then, the strip-shaped clad material 110a is cut so as to have a predetermined length in the transport direction (X direction) (cutting step). Thus, a plurality of individual clad material 110b are produced.

Figure 6:
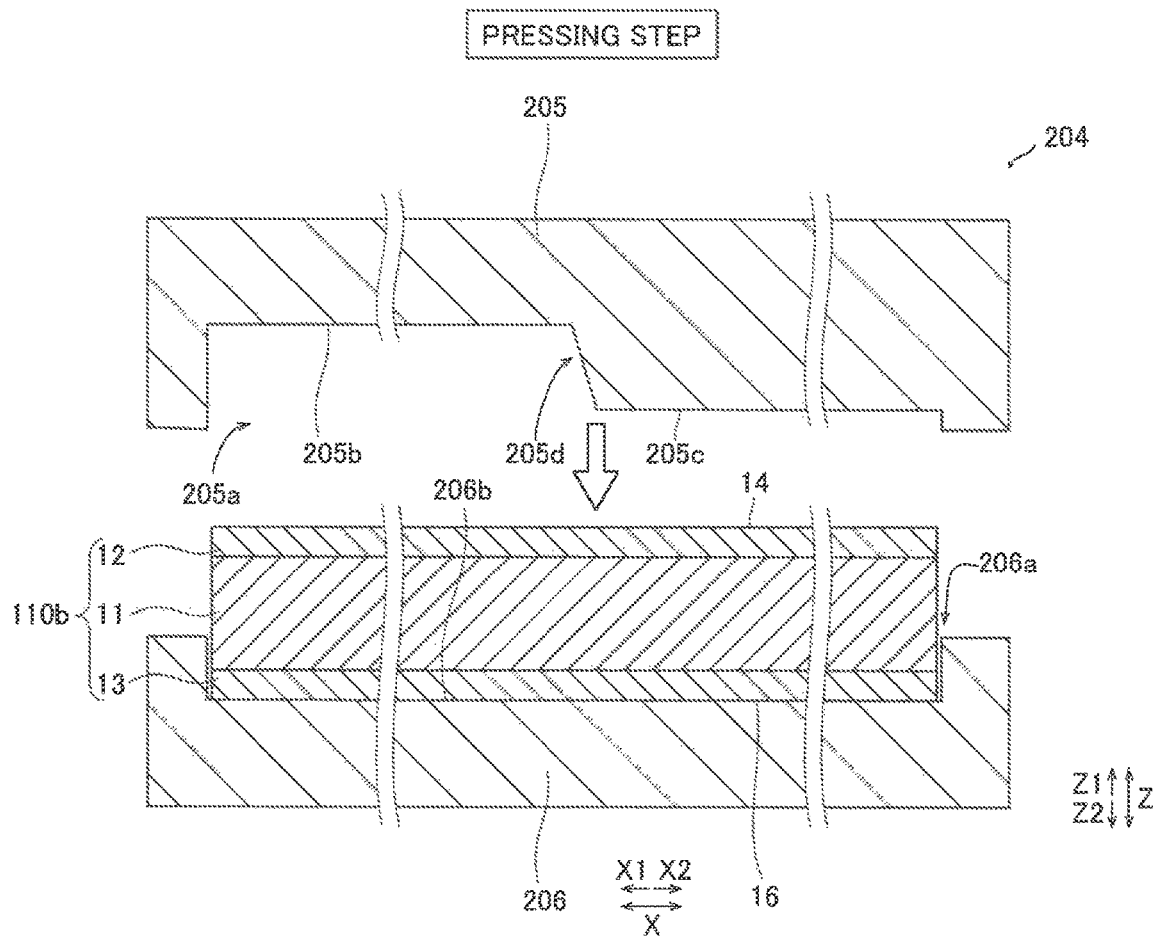
FIG. 6 A schematic sectional view for illustrating a pressing step (before pressing) in the manufacturing process for the electrical connection member according to the first embodiment of the present invention.

In the manufacturing method according to the first embodiment, as shown in FIG. 6, plastic working is performed on each of the plurality of individual clad material 110b by pressing, for example (pressing step). Specifically, a pressing machine 204 has an upper mold 205 and a lower mold 206. The lower surface (the surface on the Z2 side) of the upper mold 205 has a recess 205a that is recessed upward (in a Z1 direction). The recess 205a includes a first inner bottom surface 205b corresponding to the first surface 14a (see FIG. 2), a second inner bottom surface 205c located below the first inner bottom surface 205b and corresponding to the second surface 14b (see FIG. 2), and a step 205d that connects the first inner bottom surface 205b to the second inner bottom surface 205c. The size of the step 205d is appropriately set in consideration of a step between the connection target members (a step between the lead frame 2 and the semiconductor element 3), but the Cu layer 12 on the first surface 14a side and the Cu layer 13 on the second surface 14b side are less likely to be separated as the slope of the step 205d is gentler.

The upper surface (Z1 side surface) of the lower mold 206 has a recess 206a that is recessed downward (in a Z2 direction). The recess 206a is slightly larger than the length of the clad material 110b in the X direction such that the clad material 110b can be fitted thereinto. The inner bottom surface 206b of the recess 206a is flat unlike the recess 205a of the upper mold 205.

Figure 7:
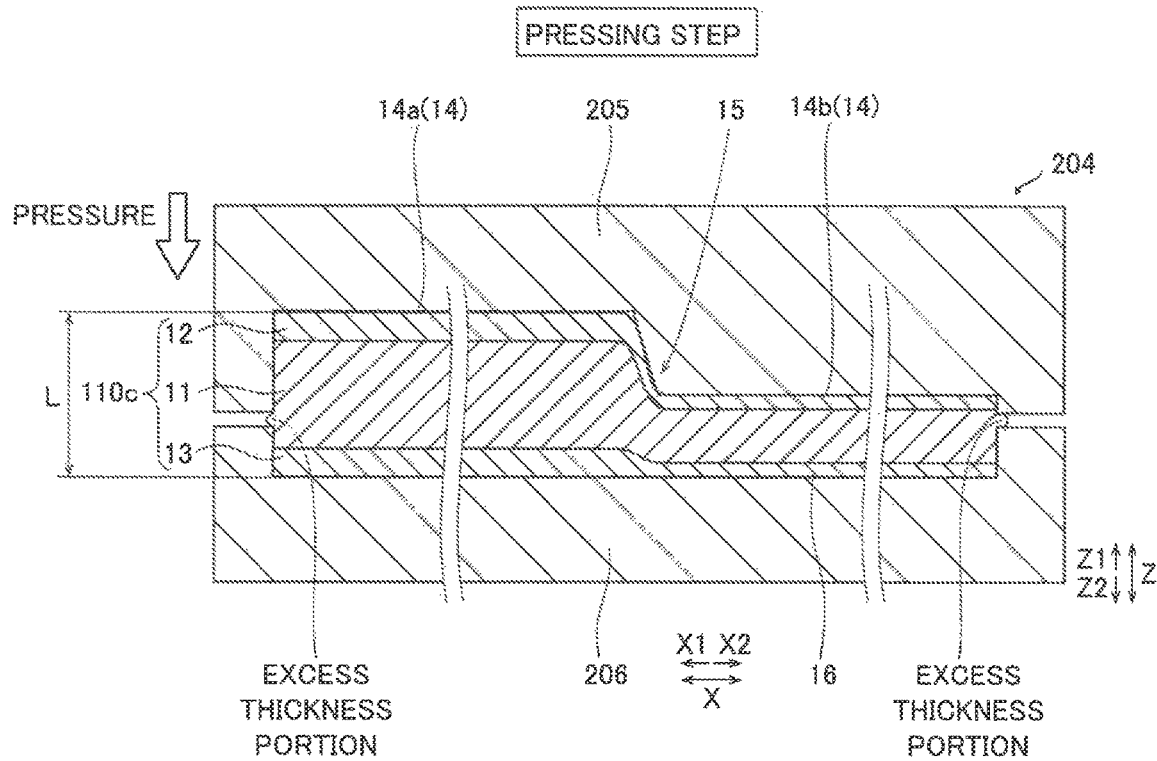
FIG. 7 A schematic sectional view for illustrating the pressing step (after pressing) in the manufacturing process for the electrical connection member according to the first embodiment of the present invention.

In the pressing machine 204, a separation distance L between the first inner bottom surface 205b of the recess 205a in the upper mold 205 and the inner bottom surface 206b of the lower mold 206 is substantially equal to the thickness of the clad material 110b in a state in which the upper mold 205 is located at the lowest point (see FIG. 7).

Then, with the clad material 110b placed on the recess 206a of the lower mold 206 such that the surface 14 on the Cu layer 12 side is located above, the upper mold 205 is moved while being pressed to the lowest point. Thus, as shown in FIG. 7, portions of the clad material 110b that face the second inner bottom surface 205c and the step 205d are crushed. Consequently, a clad material 110c in which the surface 14 on the Cu layer 12 side (Z1 side) includes the first surface 14a and the second surface 14b connected to the first surface 14a via the step 15 and located closer to the low thermal expansion layer 11 (Z2 side) than the first surface 14a is produced. The surface 16 on the side (Z2 side) opposite to the Cu layer 12 is flattened by the inner bottom surface 206b of the recess 206a.

Figure 8:
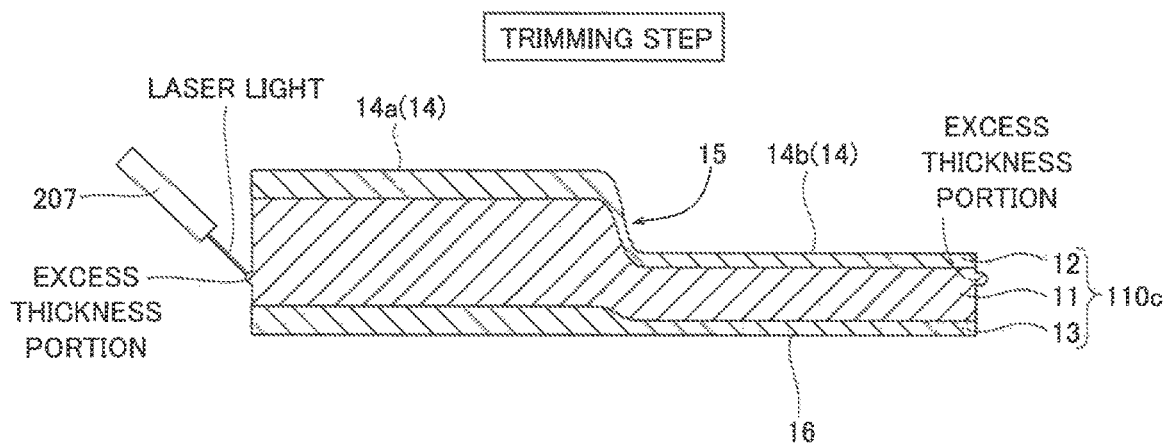
FIG. 8 A schematic sectional view for illustrating a trimming step in the manufacturing process for the electrical connection member according to the first embodiment of the present invention.

In the pressing step, a portion of the low thermal expansion layer 11, the Cu layer 12, and the Cu layer 13 may flow in a gap between the upper mold 205 and the lower mold 206 such that an excess thickness portion (an example of an unnecessary portion) is formed. Therefore, for example, as shown in FIG. 8, a laser trimming device 207 is used to remove an excess thickness portion by laser light (trimming step). Thus, the electrical connection member 1 shown in FIGS. 1 and 2 is produced.

[Method for Producing Electrical Connection Structure]

A method for producing the electrical connection structure 100a of the power module 100 using the electrical connection member 1 according to the first embodiment is now described with reference to FIGS. 1 to 4 and 9.

Figure 2:
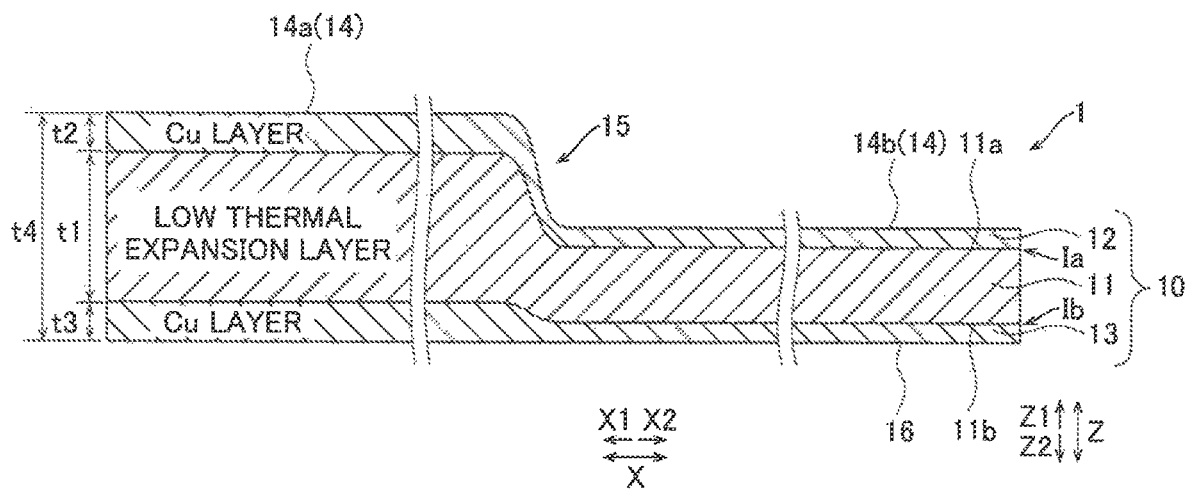
FIG. 2 A sectional view taken along the line 700-700 in FIG. 1.

First, the electrical connection member 1 shown in FIGS. 1 and 2 and the lead frame 2 on which the semiconductor element 3 is arranged are prepared. Then, the electrical connection member 1 and the lead frame 2 are arranged on a mounting table 208a in a heating furnace 208. At that time, the electrical connection member 1 inverted from the state shown in FIGS. 1 and 2 such that the surface 14 on the Cu layer 12 side is located below (Z2 side) and the surface 16 on the Cu layer 13 side is located above (Z1 side) is arranged on the upper surface (Z1 side surface) of the lead frame 2 and the upper surface of the semiconductor element 3. At that time, the connection material paste 104 is arranged between the electrical connection portion E1 of the first surface 14a and the upper surface of the lead frame 2, and the connection material paste 104 is arranged between the electrical connection portion E2 of the second surface 14b and the upper surface of the semiconductor element 3. The connection material pastes 104 contain silver oxide microparticles and a reducing agent (e.g. triethylene glycol).

Then, the electrical connection member 1 is heat-treated by adjusting a temperature inside the heating furnace 208 to 250° C. while pressing the flat surface 16 of the electrical connection member 1 from above by a pressing member 209. At this time, the inside of the heating furnace 208 is preferably a reducing atmosphere (e.g. a hydrogen atmosphere) or a non-oxidizing atmosphere (e.g. an inert gas atmosphere or a nitrogen atmosphere), but may be an atmosphere. Thus, the reducing agents of the connection material pastes 104 reduce the silver oxides of the silver oxide microparticles to generate Ag. Then, the generated Ag layers having a nano-order thickness, for example, connect the electrical connection portion E1 of the first surface 14a to the upper surface of the lead frame 2 and connect the electrical connection portion E2 of the second surface 14b to the upper surface of the semiconductor element 3. At this time, the flat surface 16 is pressed by the pressing member 209 such that an even pressure is applied to the Ag layers (connection materials 4) of the electrical connection portions E1 and E2. Consequently, the electrical connection portion E1 of the first surface 14a and the upper surface of the lead frame 2 are connected with sufficient connection strength, and the electrical connection portion E2 of the second surface 14b and the upper surface of the semiconductor element 3 are connected with sufficient connection strength. Thus, the electrical connection structure 100a of the power module 100 shown in FIGS. 3 and 4 is produced. After that, the electrical connection structure 100a of the power module 100 may be resin-molded.

In the produced electrical connection structure 100a of the power module 100, the thermal expansion of the electrical connection member 1 is significantly reduced or prevented even when the power module 100 in use reaches a high temperature of about 200° C. Consequently, in the electrical connection portion E1 and the electrical connection portion E2, damage such as cracks and peeling to the electrical connection member 1, the lead frame 2 or the semiconductor element 3, and the connection materials 4 can be significantly reduced or prevented.

Advantageous Effects of First Embodiment

In the first embodiment, the following advantageous effects are achieved.

In the first embodiment, as described above, the electrical connection member 1 includes the clad material 10 obtained by bonding the Cu layer 12 made of the Cu material, the low thermal expansion layer 11 made of the Fe material or Ni material having an average thermal expansion coefficient from room temperature to 300° C. smaller than that of the Cu layer 12, and the Cu layer 13 made of the Cu material. Accordingly, in a temperature range from room temperature to 300° C., which is the normal operating environment of the electrical connection member 1, the thermal expansion of the Cu layer 12 and the Cu layer 13 made of the Cu material having large thermal expansion can be significantly reduced or prevented by the low thermal expansion layer 11. Consequently, the thermal expansion can be reduced in the entire clad material 10 including the Cu layer 12, the Cu layer 13, and the low thermal expansion layer 11, and thus application of a stress due to the thermal expansion to the electrical connection portion E1 and the electrical connection portion E2 of the electrical connection member 1 can be significantly reduced or prevented. Therefore, damage such as cracks and peeling to the electrical connection portion E1 and the electrical connection portion E2 (connection materials 4) due to the thermal stress can be significantly reduced or prevented. Furthermore, the surface 14 of the clad material 10 on the Cu layer 12 side includes the first surface 14a and the second surface 14b connected to the first surface 14a via the step 15 and located closer to the low thermal expansion layer 11 than the first surface 14a. Thus, even when there is a difference (step) in height between the lead frame 2 and the semiconductor element 3 to which the electrical connection member 1 is electrically connected, the step 15 formed on the surface of the clad material 10 on the Cu layer 12 side can absorb the step between the lead frame 2 and the semiconductor element 3. Consequently, the influence of the step can be reduced, and uneven pressure application due to the step can be significantly reduced or prevented. Thus, in the electrical connection portion E1 and the electrical connection portion E2, the electrical connection member 1 and the lead frame 2 (semiconductor element 3) can be connected to each other with sufficient connection strength. Therefore, while damage to the electrical connection portion E1 (E2), which is a portion in which the electrical connection member 1 and the lead frame 2 (semiconductor element 3) are connected to each other via the connection material 4, due to the thermal expansion is significantly reduced or prevented, the connection can be made with sufficient connection strength in the electrical connection portion E1 (E2). Thus, it is particularly effective to use the electrical connection member 1 according to the first embodiment for the electrical connection structure 100a provided in the power module 100, which tends to become hot due to a high current flowing through it. Furthermore, during manufacturing of the clad material 10, for example, warpage of the clad material 10 due to the high ductility of the Cu layer 12 made of the Cu material can be significantly reduced or prevented by the Cu layer 13 made of the Cu material similar to that of the Cu layer 12 and bonded to the side (Z2 side) of the low thermal expansion layer 11 opposite to the Cu layer 12. Furthermore, the Cu layer 13 made of the Cu material having a low volume resistivity is provided such that the volume resistivity of the electrical connection member 1 can be effectively reduced.

In the first embodiment, as described above, the surface 14 of the clad material 10 on the Cu layer 12 side includes the first surface 14a and the second surface 14b connected to the first surface 14a via the step 15 and located closer to the low thermal expansion layer 11 than the first surface 14a. Accordingly, the lead frame 2 and the semiconductor element 3 are connected to the Cu layer 12 side of the electrical connection member 1 such that electricity (current) easily flows through the Cu layer 12 closer to the electrical connection portion E1 and the electrical connection portion E2. Thus, while the connection is made with sufficient connection strength, the Cu layer 12 through which a current flows is made of the Cu material having a low volume resistivity such that a power loss at the time of power transmission can be reduced.

In the first embodiment, as described above, the surface 16 of the clad material 10 opposite to the Cu layer 12 is flat without a step. Accordingly, when the lead frame 2 and the semiconductor element 3 are connected to the Cu layer 12 side of the electrical connection member 1, a pressure can be easily and evenly applied from the flat surface 16 on the side opposite to the Cu layer 12. Consequently, in the electrical connection portion E1 (E2), the electrical connection member 1 and the lead frame 2 (semiconductor element 3) can be connected to each other with more sufficient connection strength.

In the first embodiment, the low thermal expansion layer 11 is preferably made of the Fe material or Ni material having an average thermal expansion coefficient of $15 \times 10^{-6}$/K or less from room temperature (30° C.) to 300° C. Therefore, the thermal expansion of the Cu layer 12 (13) made of the Cu material having large thermal expansion can be effectively significantly reduced or prevented by the low thermal expansion layer 11 having an average thermal expansion coefficient of $15 \times 10^{-6}$/K or less from room temperature to 300° C. Thus, damage such as cracks and peeling to the electrical connection portion E1 (E2) can be effectively significantly reduced or prevented.

In the manufacturing method according to the first embodiment, as described above, each piece of clad material 110b is plastically worked by pressing, for example. Accordingly, on the surface 14 of the clad material 10 on the Cu layer 12 side, the first surface 14a and the second surface 14b connected to the first surface 14a via the step 15 and located closer to the low thermal expansion layer 11 than the first surface 14a can be easily formed.

Second Embodiment

A second embodiment of the present invention is now described with reference to FIGS. 10 and 11. In the second embodiment, a case in which a portion of an electrical connection member 301 is divided into a plurality of portions unlike the electrical connection member 1 according to the first embodiment is described. The same configurations as those of the first embodiment are denoted by the same reference numerals and description thereof is omitted.

Figure 10:
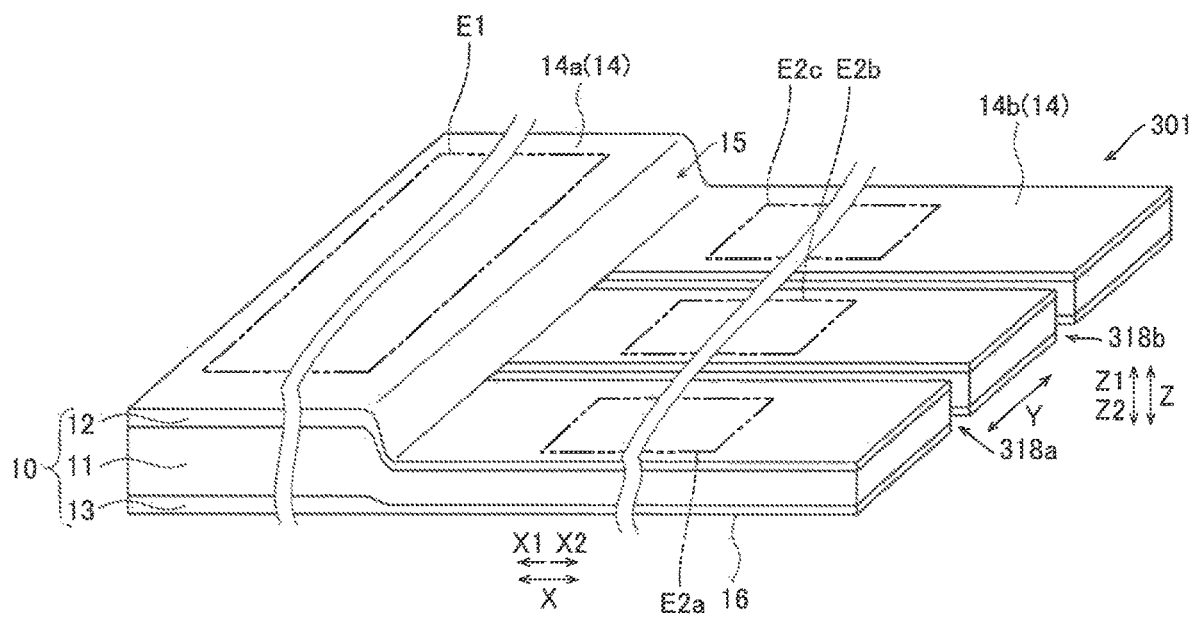
FIG. 10 A perspective view showing an electrical connection member according to a second embodiment of the present invention.
Figure 11:
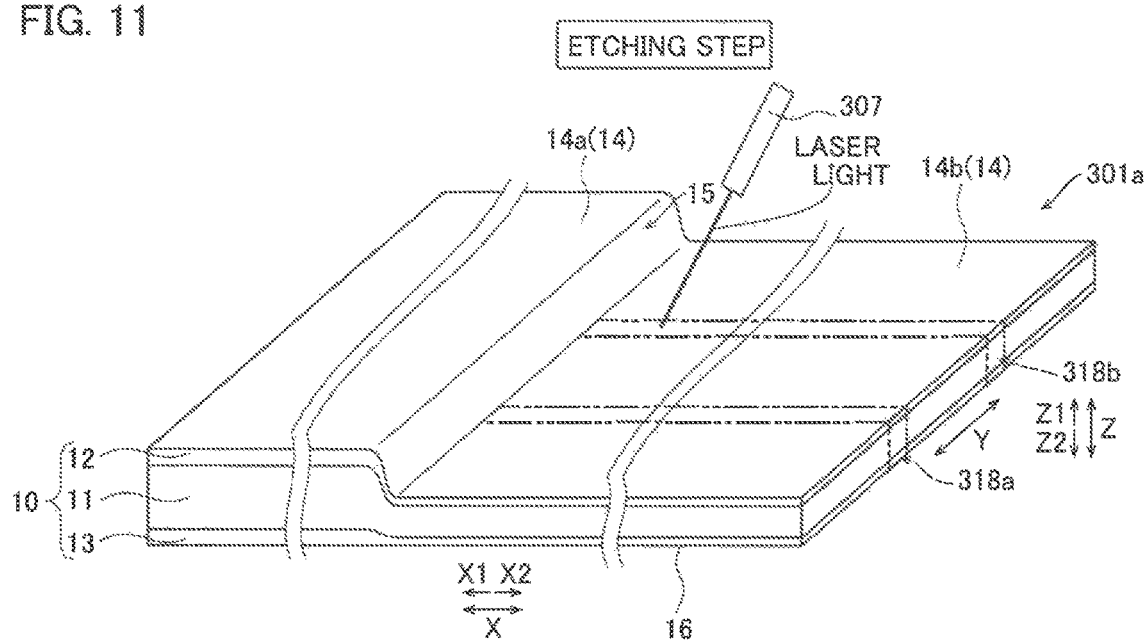
FIG. 11 A schematic perspective view for illustrating an etching step in a manufacturing process for the electrical connection member according to the second embodiment of the present invention.

In the electrical connection member 301 according to the second embodiment of the present invention, as shown in FIG. 10, a portion of a clad material 10 on the second surface 14b side is divided into a plurality of (three) portions along a Y direction in which a step 15 extends. Specifically, on the second surface 14b side of the clad material 10, two notches 318a and 318b that extend in an X direction from the vicinity of the step 15 to an end of the clad material 10 on the X2 side are formed. The notch 318a and the notch 318b are formed at a predetermined distance in the Y direction in which the step 15 extends. Consequently, the portion of the clad material 10 on the second surface 14b side is divided into a plurality of portions along the Y direction in which the step 15 extends. Therefore, on the second surface 14b side of the clad material 10, three electrical connection portions E2a, E2b, and E2c that protrude in the X direction can be provided. Thus, one connection target member (a lead frame 2, see FIG. 3) arranged in an electrical connection portion E1 of a first surface 14a, and three other connection target members (semiconductor elements 3, see FIG. 3) respectively arranged in the electrical connection portion E2a, the electrical connection portion E2b, and the electrical connection portion E2c of the second surface 14b can be electrically connected to each other by one electrical connection member 301. The remaining configurations of the second embodiment are similar to the configurations of the first embodiment.

A method for manufacturing the electrical connection member 301 according to the second embodiment is now described with reference to FIGS. 10 and 11. The manufacturing method up to a pressing step is the same as the manufacturing method according to the first embodiment, and thus description thereof is omitted.

In the method for manufacturing the electrical connection member 301 according to the second embodiment, the two notches 318a and 318b are formed by performing a laser etching process on a clad material 301a after the pressing step (etching step). Specifically, portions of the clad material 301a corresponding to the two notches 318a and 318b are removed by etching using a laser etching device 307. Thus, the two notches 318a and 318b that extend in the X direction from the vicinity of the step 15 to the end of the clad material 10 on the X2 side are formed on the second surface 14b side of the clad material 10. Consequently, the portion of the clad material 10 on the second surface 14b side is divided into a plurality of (three) portions along the Y direction in which the step 15 extends. Then, a trimming step is performed similarly to the manufacturing method according to the first embodiment such that the electrical connection member 301 shown in FIG. 10 is produced.

Advantageous Effects of Second Embodiment

In the second embodiment, the following advantageous effects are achieved.

In the second embodiment, as described above, the electrical connection member 301 includes the clad material 10 obtained by bonding a Cu layer 12 made of a Cu material, a low thermal expansion layer 11 made of an Fe material or Ni material having an average thermal expansion coefficient from room temperature to 300° C. smaller than that of the Cu layer 12, and a Cu layer 13 made of a Cu material. Accordingly, similarly to the first embodiment, while damage to the electrical connection portion E1 and the electrical connection portions E2a to E2c due to thermal expansion is significantly reduced or prevented, a connection can be made with sufficient connection strength in the electrical connection portion E1 and the electrical connection portions E2a to E2c.

In the second embodiment, as described above, the portion of the clad material 10 on the second surface 14b side is divided into a plurality of (three) portions along the Y direction in which the step 15 extends. Accordingly, a plurality of electrical connection portions E1 to E3 that protrude in the X direction intersecting with the Y direction in which the step 15 extends are formed in the plurality of portions divided on the second surface 14b side of the clad material 10, and thus one connection target member arranged on the first surface 14a side and a plurality of other connection target members arranged on the second surface 14b side can be electrically connected to each other by one electrical connection member 301. Consequently, as compared with a case in which one connection target member arranged on the first surface 14a side and one of a plurality of other connection target members arranged on the second surface 14b side are electrically connected to each other by one electrical connection member 301, the number of electrical connection members 301 required for connection can be effectively reduced. The remaining advantageous effects of the second embodiment are similar to the advantageous effects of the first embodiment.

Third Embodiment

A third embodiment of the present invention is now described with reference to FIG. 12. In the third embodiment, a case in which a plated layer 417a and a plated layer 417b are further provided in the electrical connection portion E1 and the electrical connection portion E2 of the electrical connection member 1 according to the first embodiment, respectively, is described. The same configurations as those of the first embodiment are denoted by the same reference numerals and description thereof is omitted.

Figure 12:
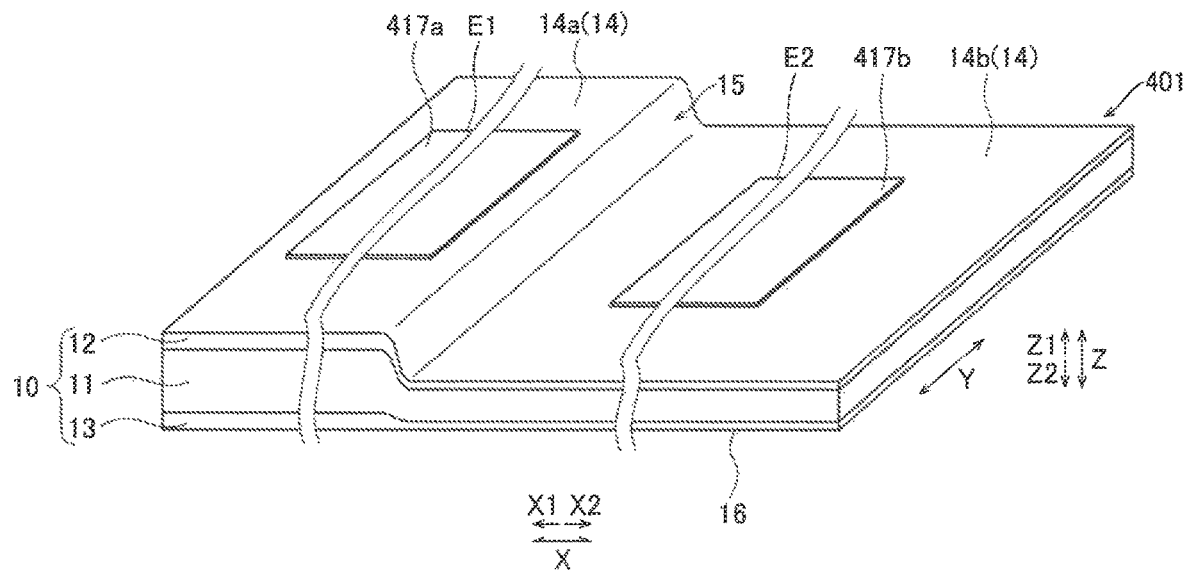
FIG. 12 A perspective view showing an electrical connection member according to a third embodiment of the present invention.

In an electrical connection member 401 according to the third embodiment of the present invention, as shown in FIG. 12, an electrical connection portion E1 of a first surface 14a and an electrical connection portion E2 of a second surface 14b of a clad material 10 include the plated layer 417a and the plated layer 417b, respectively. The plated layer 417a and the plated layer 417b are provided to improve the wettability of connection materials (e.g. connection materials 4, see FIG. 4) made of a metal material.

Specifically, the plated layer 417a and the plated layer 417b are made of Ag, a Ag alloy, Ni, or a Ni alloy. An example of the plated layer 417a and the plated layer 417b made of Ag includes a Ag-plated layer obtained by a matte silver plating process. Examples of the plated layer 417a and the plated layer 417b made of a Ag alloy include a Ag alloy-plated layer obtained by a glossy silver plating process and a Ag alloy-plated layer containing Cu and obtained by an electrolytic plating process. An example of the plated layer 417a and the plated layer 417b made of Ni includes a Ni-plated layer obtained by an electrolytic plating process. An example of the plated layer 417a and the plated layer 417b made of a Ni alloy includes a Ni—P alloy-plated layer obtained by an electroless plating process.

The thicknesses of the plated layer 417a and the plated layer 417b are the minimum thickness that enables improvement of the wettability of the connection materials, e.g. a thickness of 5 μm or more that is less susceptible to the influence of a base (Cu layer 12), and are preferably 10 μm or less in order to reduce the manufacturing cost. Thus, the plated layer 417a and the plated layer 417b can be formed in a short time, and the consumption of materials of the plated layer 417a and the plated layer 417b can be reduced.

The remaining configurations of the third embodiment are similar to the configurations of the first embodiment. The electrical connection member 401 according to the third embodiment can be produced by performing a predetermined plating process on the electrical connection member 1 produced by the manufacturing method according to the first embodiment. During the plating process, it is necessary to form a mask on a portion in which the plated layer 417a and the plated layer 417b are not formed.

Advantageous Effects of Third Embodiment

In the third embodiment, the following advantageous effects are achieved.

In the third embodiment, as described above, the electrical connection member 401 includes the clad material 10 obtained by bonding the Cu layer 12 made of a Cu material, a low thermal expansion layer 11 made of an Fe material or Ni material having an average thermal expansion coefficient from room temperature to 300° C. smaller than that of the Cu layer 12, and a Cu layer 13 made of a Cu material. Accordingly, similarly to the first embodiment, while damage to the electrical connection portion E1 and the electrical connection portion E2 due to thermal expansion is significantly reduced or prevented, a connection can be made with sufficient connection strength in the electrical connection portion E1 and the electrical connection portion E2.

In the third embodiment, as described above, the electrical connection portion E1 of the first surface 14a and the electrical connection portion E2 of the second surface 14b of the clad material 10 respectively include the plated layer 417a and the plated layer 417b made of Ag, a Ag alloy, Ni, or a Ni alloy. Accordingly, when connection materials made of a metal material such as brazing filler metal are used to connect the electrical connection member 401 to the connection target members, the wettability of the connection materials can be improved by the plated layer 417a and the plated layer 417b. Consequently, the electrical connection member 401 and the connection target members can be reliably connected to each other by the connection materials. The remaining advantageous effects of the third embodiment are similar to the advantageous effects of the first embodiment.

Modified Example of Third Embodiment

A modified example of the third embodiment of the present invention is now described with reference to FIG. 13. In the modified example of the third embodiment, a case in which a plated layer 517 is provided over the entire surface of a clad material 10 unlike the electrical connection member 401 according to the third embodiment is described. The same configurations as those of the third embodiment are denoted by the same reference numerals and description thereof is omitted.

Figure 13:
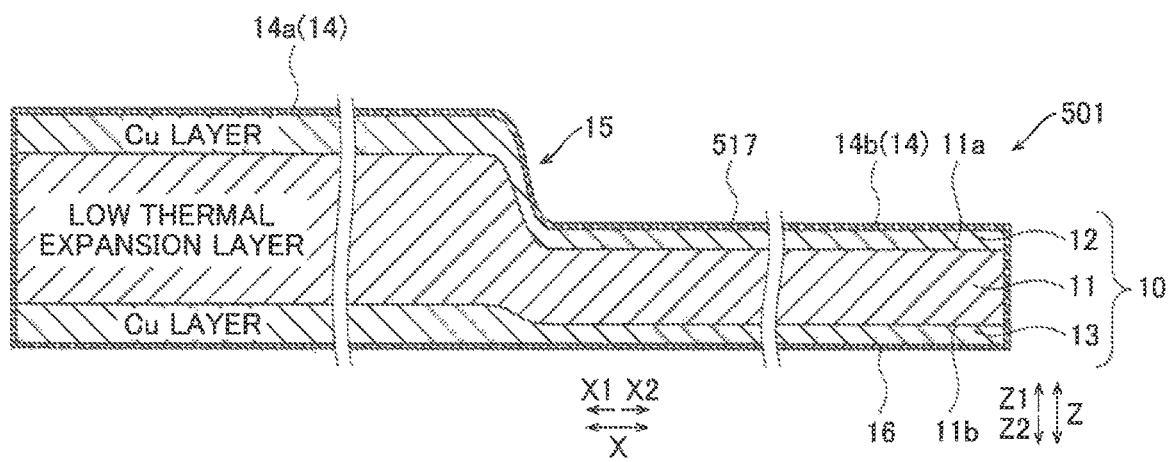
FIG. 13 A sectional view showing an electrical connection member according to a modified example of the third embodiment of the present invention.

In an electrical connection member 501 according to the modified example of the third embodiment of the present invention, as shown in FIG. 13, the plated layer 517 made of Ag, a Ag alloy, Ni, or a Ni alloy is formed on the entire surface of the clad material 10. That is, the plated layer 517 is formed on not only a surface 14 of the clad material 10 on the Cu layer 12 side, but also a surface 16 on the side opposite to a Cu layer 12 and side surfaces of the clad material 10. Consequently, an entire first surface 14a can be suitably used as an electrical connection portion, and an entire second surface 14b can be suitably used as an electrical connection portion.

The remaining configurations of the modified example of the third embodiment are similar to the configurations of the third embodiment. Furthermore, a method for manufacturing the electrical connection member 501 according to the modified example of the third embodiment is similar to the manufacturing method according to the third embodiment except that the plated layer 517 is formed without forming a mask.

Advantageous Effects of Modified Example of Third Embodiment

In the modified example of the third embodiment, the following advantageous effects are achieved.

In the modified example of the third embodiment, as described above, the plated layer 517 is formed on the entire surface of the clad material 10. Accordingly, unlike a case in which the plated layer is formed only on a portion of the surface of the clad material 10, it is not necessary to form a mask, and thus the plated layer 517 can be easily formed. Furthermore, an electrical connection portion E1 and an electrical connection portion E2 can be ensured in wide ranges of the first surface 14a and the second surface 14b, respectively, and thus the electrical connection member 501 and connection target members can be reliably and easily connected to each other by connection materials. Moreover, the corrosion resistance of the clad material 10 can be improved by the plated layer 517 using Ag, a Ag alloy, Ni, or a Ni alloy, which is superior in corrosion resistance as compared with Cu and an Fe alloy containing no Cr. The remaining advantageous effects of the modified example of the third embodiment are similar to the advantageous effects of the third embodiment.

Modified Examples

The embodiments disclosed this time must be considered as illustrative in all points and not restrictive. The scope of the present invention is not shown by the above description of the embodiments but by the scope of claims for patent, and all modifications within the meaning and range equivalent to the scope of claims for patent are further included.

Figure 14:
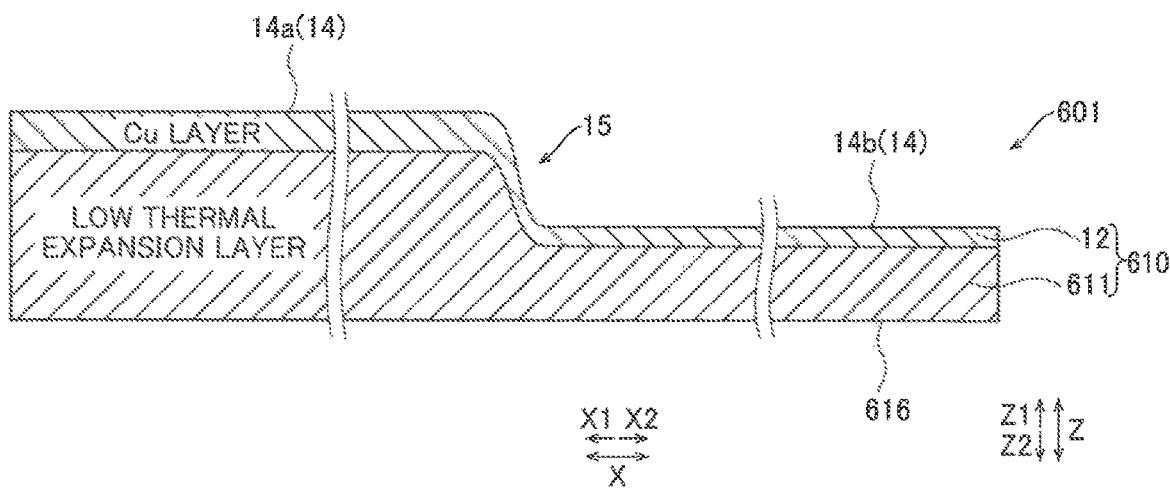
FIG. 14 A sectional view showing an electrical connection member according to a modified example of the first embodiment of the present invention.

For example, while the example in which the clad material 10 has a three-layered structure in which the Cu layer 12, the low thermal expansion layer 11, and the Cu layer 13 are bonded in a state in which the same are stacked in this order has been shown in each of the aforementioned first to third embodiments, the present invention is not restricted to this. In the present invention, the clad material may have a two-layered structure or a four-or-more-layered structure. For example, as in a modified example of the first embodiment shown in FIG. 14, a clad material 610 may have a two-layered structure in which a Cu layer 12 made of a Cu material and a low thermal expansion layer 611 made of an Fe material or Ni material having an average thermal expansion coefficient from room temperature to 300° C. smaller than that of the first Cu layer are bonded. In this case, a step 15 is formed on the Cu layer 12 side (Z1 side) of the low thermal expansion layer 611, and a first surface 14a and a second surface 14b respectively including electrical connection portions E1 and E2 (see FIG. 1) are provided. A surface 616 (Z2 side) of the low thermal expansion layer 611 opposite to the Cu layer 12 is preferably flat. Thus, a second Cu layer, which easily expands thermally, is not provided unlike the first to third embodiments described above, and thus damage to the electrical connection portions due to thermal expansion can conceivably be more reliably significantly reduced or prevented.

While the example in which the strip-shaped clad material 110a is cut to a predetermined length in the transport direction, and then plastic working is performed by pressing, for example, such that the clad material 10 including the first surface 14a, the second surface 14b, and the step 15 is produced has been shown in the aforementioned first embodiment, the present invention is not restricted to this. In the present invention, for example, after plastic working is performed by pressing such that the strip-shaped clad material including the first surface, the second surface, and the step is produced, the strip-shaped clad material may be cut to a predetermined length in the transport direction. Thus, electrical connection members can be continuously produced.

In this case, the trimming step is preferably performed after the pressing step and before the cutting step. Also in the second embodiment, similarly, after plastic working is performed by pressing, for example, such that the strip-shaped clad material including the first surface, the second surface, and the step is produced, the strip-shaped clad material may be cut to a predetermined length in the transport direction. In this case, the etching step in which the notches are formed is performed after the pressing step and before the cutting step (before the etching step).

While the example in which each piece of clad material 110b is plastically worked by pressing, for example, such that on the surface 14 of the clad material 10 on the Cu layer 12 side, the first surface 14a and the second surface 14b connected to the first surface 14a via the step 15 and located closer to the low thermal expansion layer 11 than the first surface 14a are formed has been shown in the aforementioned first embodiment, the present invention is not restricted to this. In the present invention, the first surface, the second surface, and the step may be formed by plastic working by a method other than pressing. For example, the first surface, the second surface, and the step may be formed by performing plastic working by so-called roll reduction in which the thickness is reduced by applying a pressure using a roller only to a portion of the clad material corresponding to the second surface.

While the example in which using the laser trimming device 207, the excess thickness portion is removed by laser light has been shown in the aforementioned first embodiment, the present invention is not restricted to this. In the present invention, the excess thickness portion may be removed by a method other than laser light. For example, the excess thickness portion may be removed by pressing using a press trimming device, or the clad material may pass between a plurality of cutters arranged at a predetermined distance, and a portion other than a portion between the cutters may be removed (so-called slitting) such that the excess thickness portion is removed. Alternatively, depending on the condition and use of the clad material after the pressing step, it is not necessary to remove the excess thickness portion.

While the example in which the two notches 318a and 318b are formed by performing the laser etching process on the clad material 301a after the pressing step has been shown in the aforementioned second embodiment, the present invention is not restricted to this. In the present invention, the notches may be formed by a process method other than the laser etching process. For example, the notches may be formed by punching portions of the clad material corresponding to the notches with a pressing machine.

While the example in which the portion of the clad material 10 on the second surface 14b side is divided into three portions along the Y direction in which the step 15 extends has been shown in the aforementioned second embodiment, the present invention is not restricted to this. In the present invention, the portion of the clad material on the second surface side may be divided into two or four or more portions.

While the example in which trimming is performed after laser etching has been shown in the aforementioned second embodiment, the present invention is not restricted to this. In the present invention, after trimming, laser etching may be performed.

While the example in which the electrical connection member 1 and the connection target members (the lead frame 2 and the semiconductor element 3) are connected to each other using the connection materials 4 made of Ag (silver) obtained by reducing the connection material pastes 104 containing silver oxide microparticles and a reducing agent by heat treatment has been shown in the aforementioned first embodiment, the present invention is not restricted to this. In the present invention, a material for the connection materials is not particularly limited as long as it has conductivity. For example, as the connection materials, a metal material such as solder or a conductive adhesive may be used. Alternatively, the electrical connection member and the connection target members may be connected to each other by laser welding or ultrasonic welding. In this case, the plated layers according to the third embodiment are formed in the electrical connection portions of the electrical connection member such that the plated layers and their vicinities are melted by welding heat to become connection materials, and thus the electrical connection member and the connection target members can be easily connected to each other.

While the example in which the surface 16 of the clad material 10 opposite to the Cu layer 12 (first Cu layer) is flat has been shown in each of the aforementioned first to third embodiments, the present invention is not restricted to this. In the present invention, the surface of the clad material opposite to the first Cu layer may not be flat.

DESCRIPTION OF REFERENCE NUMERALS 1, 301, 401, 501, 601: electrical connection member
2: lead frame (connection target member)
3: semiconductor element (connection target member)
10, 110, 610: clad material
11, 611: low thermal expansion layer
12: Cu layer (first Cu layer)
13: Cu layer (second Cu layer)
14: surface (surface on the first Cu layer side)
14a: first surface
14b: second surface
15: step
16, 616: surface (surface opposite to the first Cu layer)
100a: electrical connection structure
417a, 417b, 51%: plated layer

The invention claimed is:

1. An electrical connection member (1, 301, 401, 501, 601) comprising: a clad material (10, 110, 610) including at least both a first Cu layer (12) made of a Cu material and a low thermal expansion layer (11) made of an Fe material or Ni material having an average thermal expansion coefficient from room temperature to 300° C. smaller than that of the first Cu layer, the first Cu layer and the low thermal expansion layer being bonded to each other; wherein a surface of the clad material on a side of the first Cu layer includes a first surface (14a) connected to a first connection target member and a second surface (14b) directly connected to the first surface via a step (15), which inclines with regard to a stacking direction, and located closer to the low thermal expansion layer than the first surface and connected to a second connection target member, a first thickness of the clad material of the first surface is greater than a second thickness of the clad material of the second surface, and wherein a thickness of the clad material gradually decreases from the first thickness of the first surface to the second thickness of the second surface in the step.

2. The electrical connection member according to claim 1, wherein a surface of the clad material opposite to the first Cu layer is flat without a step.

3. The electrical connection member according to claim 1, wherein the clad material further includes a second Cu layer

(13) bonded to a side of the low thermal expansion layer opposite to the first Cu layer and made of a Cu material.

4. The electrical connection member according to claim 1, wherein a portion of the clad material on a side of the second surface is divided into a plurality of portions along a direction in which the step extends.

5. The electrical connection member according to claim 1, wherein the low thermal expansion layer is made of an Fe material or Ni material having an average thermal expansion coefficient of $15 \times 10^{-6}$/K or less from room temperature to 300° C.

6. The electrical connection member according to claim 1, wherein
- each of the first surface and the second surface includes an electrical connection portion; and
- at least one of the electrical connection portion of the first surface or the electrical connection portion of the second surface includes a plated layer made of Ag, a Ag alloy, Ni, or a Ni alloy.

7. The electrical connection member according to claim 6, wherein the plated layer is formed on an entire surface of the clad material.

8. An electrical connection structure (100a) comprising: an electrical connection member (1, 301, 401, 501, 601) including a clad material (10, 110, 610) that includes at least both a first Cu layer (12) made of a Cu material and a low thermal expansion layer (11) made of an Fe material or Ni material having an average thermal expansion coefficient from room temperature to 300° C. smaller than that of the first Cu layer, the first Cu layer and the low thermal expansion layer being bonded to each other, the clad material having a surface on a side of the first Cu layer, the surface including a first surface (14a) connected to a first connection target member and a second surface (14b) directly connected to the first surface via a step (15), which inclines with regard to a stacking direction, and located closer to the low thermal expansion layer than the first surface and connected to a second connection target member, a first thickness of the clad material of the first surface is greater than a second thickness of the clad material of the second surface, and wherein a thickness of the clad material gradually decreases from the first thickness of the first surface to the second thickness of the second surface in the step; and a connection material to connect the electrical connection member to the first connection target member in an electrical connection portion of the first surface and to connect the electrical connection member to the second connection target member in an electrical connection portion of the second surface.

9. The electrical connection member according to claim 1, wherein the step has a length in a stacking direction equal to a difference between a thickness of the first connection target member connected to the first surface and a thickness of the second connection target member connected to the second surface.

10. The electrical connection structure according to claim 8, wherein the step has a length in a stacking direction equal to a difference between a thickness of the first connection target member connected to the first surface and a thickness of the second connection target member connected to the second surface.

* * * * *